United States Patent
Kwon et al.

(10) Patent No.: US 12,349,288 B2
(45) Date of Patent: Jul. 1, 2025

(54) CIRCUIT BOARD INCLUDING A CORE LAYER PROVIDED WITH PLURALITY OF INSULATING LAYERS

(71) Applicant: LG INNOTEK CO., LTD., Seoul (KR)

(72) Inventors: Myung Jae Kwon, Seoul (KR); Sang Hyuck Nam, Seoul (KR); Jin Hyoung Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 217 days.

(21) Appl. No.: 18/098,578

(22) Filed: Jan. 18, 2023

(65) Prior Publication Data

US 2023/0232544 A1    Jul. 20, 2023

(30) Foreign Application Priority Data

Jan. 18, 2022    (KR) .................. 10-2022-0007505

(51) Int. Cl.
  *H05K 3/46*   (2006.01)
  *H05K 1/11*   (2006.01)
  *H05K 3/42*   (2006.01)

(52) U.S. Cl.
  CPC .......... *H05K 3/4644* (2013.01); *H05K 1/115* (2013.01); *H05K 3/427* (2013.01); *H05K 2201/0959* (2013.01)

(58) Field of Classification Search
  CPC ...... H05K 3/4644; H05K 1/115; H05K 3/427; H05K 2201/0959
  USPC .............................................. 174/255
  See application file for complete search history.

(56) References Cited

U.S. PATENT DOCUMENTS

| | | | |
|---|---|---|---|
| 7,707,716 B2 | 5/2010 | Song et al. | |
| 10,790,255 B2 | 9/2020 | Kim et al. | |
| 2004/0241904 A1* | 12/2004 | Lee | H05K 3/28 174/262 |
| 2006/0065434 A1* | 3/2006 | Hsu | H05K 1/0216 174/262 |
| 2006/0108143 A1* | 5/2006 | Hsu | H05K 3/4602 174/255 |
| 2021/0378092 A1* | 12/2021 | Lin | H05K 3/4602 |

FOREIGN PATENT DOCUMENTS

| | | |
|---|---|---|
| KR | 10-2007-0109264 A | 11/2007 |
| KR | 10-2020-0035600 A | 4/2020 |

* cited by examiner

*Primary Examiner* — Timothy J Thompson
*Assistant Examiner* — Michael F McAllister
(74) *Attorney, Agent, or Firm* — Birch, Stewart, Kolasch & Birch, LLP

(57) ABSTRACT

A semiconductor package according to an embodiment includes a first insulating layer including a through hole; an insulating member disposed in the through hole of the first insulating layer; a first electrode layer disposed on the insulating member; a second insulating layer disposed on the first electrode layer; and a first through electrode passing through the second insulating layer, wherein the first through electrode overlaps the first electrode layer and the insulating member in a vertical direction.

17 Claims, 8 Drawing Sheets

CIRCUIT BOARD INCLUDING A CORE LAYER PROVIDED WITH PLURALITY OF INSULATING LAYERS

CROSS-REFERENCE TO RELATED APPLICATIONS

The present application claims priority under 35 U.S.C. 119 and 35 U.S.C. 365 to Korean Patent Application No. 10-2022-0007505 (filed on Jan. 18, 2022), which is hereby incorporated by reference in its entirety.

TECHNICAL FIELD

The embodiment relates to a semiconductor package, and particularly relates to a semiconductor package including a core layer.

BACKGROUND

Recently, a circuit board have been provided as a multilayer circuit board. Such a multilayer circuit board is manufactured by forming an inner electrode layer by applying an additive or subtractive method to a surface of a core substrate such as a copper clad laminate (CCL) and forming an outer electrode layer in a same way as the inner electrode layer while sequentially stacking an insulating layer.

Meanwhile, the circuit board includes a through electrode. The through electrode electrically connects electrode layers disposed on different layers. For example, the through electrode electrically connects an inner electrode layer and an outer electrode layer. That is, the through electrode of the circuit board is formed by forming a through hole in the core substrate and chemically and/or electrically plating an inside of the formed through hole.

In this case, in a conventional circuit board, a thickness of the core board is increased to improve strength and warpage properties. For example, the core substrate has a thickness of 200 μm or more. Preferably, the thickness of the conventional core substrate ranges from 400 μm to 800 μm. In this case, when the thickness of the core substrate increases, a drill size used in a process of forming the through hole passing through the core substrate also increases. In addition, when the size of the drill increases, there is a problem in that a size of the through hole and a size of the through electrode increase correspondingly thereto.

Furthermore, a conventional circuit board has limitations in miniaturizing the electrode layer due to the increase in the thickness of the core substrate and the size of the through electrode. For example, a line width of an electrode layer of a conventional circuit board exceeds 30 μm. For example, a space between electrode layers of a conventional circuit board exceeds 30 μm.

Accordingly, in a circuit board including a core substrate, there is a need for a method of reducing the line width and space of the electrode layer while reducing the size of the through electrode.

SUMMARY

An embodiment provides a circuit board including a core layer having a new structure and a semiconductor package including the same.

In addition, the embodiment provides a circuit board including a core layer composed of a plurality of insulating layers of different materials and a semiconductor package including the same.

In addition, the embodiment provides a circuit board capable of miniaturizing a line width and a space of an electrode layer disposed on a core layer and a semiconductor package including the circuit board.

Technical problems to be solved by the proposed embodiments are not limited to the above-mentioned technical problems, and other technical problems not mentioned may be clearly understood by those skilled in the art to which the embodiments proposed from the following descriptions belong.

A semiconductor package according to an embodiment includes a first insulating layer including a through hole; an insulating member disposed in the through hole of the first insulating layer; a first electrode layer disposed on the insulating member; a second insulating layer disposed on the first electrode layer; and a first through electrode passing through the second insulating layer, wherein the first through electrode overlaps the first electrode layer and the insulating member in a vertical direction.

In addition, the semiconductor package further includes a second through electrode disposed in the through hole and surrounding at least a part of the insulating member; and wherein the first electrode layer is disposed on the second through electrode and the insulating member.

In addition, the first electrode layer includes: a first region overlapping the first insulating layer in a vertical direction; and a second region overlapping the insulating member in a vertical direction; wherein a thickness of the first region of the first electrode layer is different from a thickness of the second region of the first electrode layer.

In addition, the thickness of the first region of the first electrode layer is greater than the thickness of the second region of the first electrode layer.

In addition, the first electrode layer further includes a third region provided between the first region and the second region and overlapping the first through electrode in a vertical direction; and a thickness of the third region of the first electrode layer is greater than the thickness of the second region.

In addition, an upper surface of the insulating member is positioned higher than an upper surface of the first insulating layer.

In addition, the first electrode layer includes: a first metal layer disposed on an upper surface of the first insulating layer; and a second metal layer disposed on the first metal layer and the first through electrode.

In addition, a thickness of the first region of the second metal layer of the first electrode layer is different from a thickness of the second region of the second metal layer of the first electrode layer, and wherein a lower surface of the second metal layer includes a concave portion concave toward the insulating member.

In addition, the first insulating layer includes a copper clad laminate (CCL).

In addition, the first insulating layer has a thickness ranging from 80 μm to 150 μm.

In addition, the semiconductor package further includes a second electrode layer disposed on the first through electrode, and wherein the second electrode layer overlaps the first through electrode in a vertical direction.

In addition, the second insulating layer includes any one of prepreg and ABF (Ajinomoto Build-up Film).

In addition, the first insulating layer and the second insulating layer is a core layer of a circuit board.

In addition, the first through electrode, the first electrode layer, and the second through electrode are a core through electrode passing through an upper surface and a lower surface of the core layer.

In addition, the first through electrode is not disposed in a region of the second insulating layer that does not vertically overlap the second through electrode.

In addition, an inclination of a side surface of the second through electrode is perpendicular to an upper surface or a lower surface of the first insulating layer.

In addition, a shape of the first through electrode is different from a shape of the second through electrode.

In addition, the semiconductor package further includes a third insulating layer disposed on the second insulating layer; a third electrode layer disposed on the third insulating layer; a connection portion disposed on the third electrode layer; and a semiconductor device disposed on the connection portion.

Advantageous Effects

A circuit board of an embodiment includes a through electrode layer passing through a first insulating layer and a first electrode layer disposed on the first insulating layer. In this case, the through electrode layer includes a first through electrode disposed on an inner wall of a first through hole and an insulating member passing through the first insulating layer. The first electrode layer includes a first region R1 that does not vertically overlap the insulating member and a second region R2 that vertically overlaps the insulating member. The first region R1 of the first electrode layer has a multilayer structure including a first metal layer and a second metal layer. The second region R2 of the first electrode layer may include only the second metal layer. For example, a number of metal layers in the first region R1 of the first electrode layer may be greater than a number of metal layers in the second region R2 of the first electrode layer.

Accordingly, a thickness of the first region R1 of the first electrode layer may be greater than that of the second region R2. Preferably, a thickness of the first electrode layer in a region vertically overlapping with the insulating member may be smaller than a thickness of the first electrode layer in a region not vertically overlapping with the insulating member. Accordingly, the embodiment may reduce a thickness of the first electrode layer in the second region R2 compared to a comparative example. Accordingly, the embodiment can reduce a plating process time for forming the first electrode layer, and further reduce a cost in the plating process.

As described above, a core layer of the circuit board is not composed of only a copper clad laminate, but is composed of a combination of the copper clad laminate and prepreg or ABF. Accordingly, the embodiment can reduce a thickness of an electrode layers disposed on an upper surface and a lower surface of the core layer of the circuit board. In addition, the embodiment can reduce a line width and a space of the electrode layer disposed on the upper and lower surfaces of the core layer of the circuit board. Accordingly, in the embodiment, it is possible to miniaturize the electrode layers disposed on the upper and lower surfaces of the core layer, and accordingly, an overall thickness of the circuit board can be reduced.

DETAILED DESCRIPTION OF THE EMBODIMENTS

Hereinafter, embodiments of the present invention will be described in detail with reference to the accompanying drawings.

However, the spirit and scope of the embodiment is not limited to a part of the embodiments described, and may be implemented in various other forms, and within the spirit and scope of the present invention, one or more of the elements of the embodiments may be selectively combined and replaced.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. In addition, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". Further, in describing the elements of the embodiments of the present invention, the terms such as first, second, A, B, (A, and (b) may be used.

These terms are only used to distinguish the elements from other elements, and the terms are not limited to the essence, order, or order of the elements. In addition, when an element is described as being "connected", or "coupled" to another element, it may include not only when the element is directly "connected" to, or "coupled" to other elements, but also when the element is "connected", or "coupled" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements. Furthermore, when expressed as "on (over)" or "under (below)", it may include not only the upper direction but also the lower direction based on one element.

Comparison Example (Structure of a Prior Art and its Problems)

Figure 1:
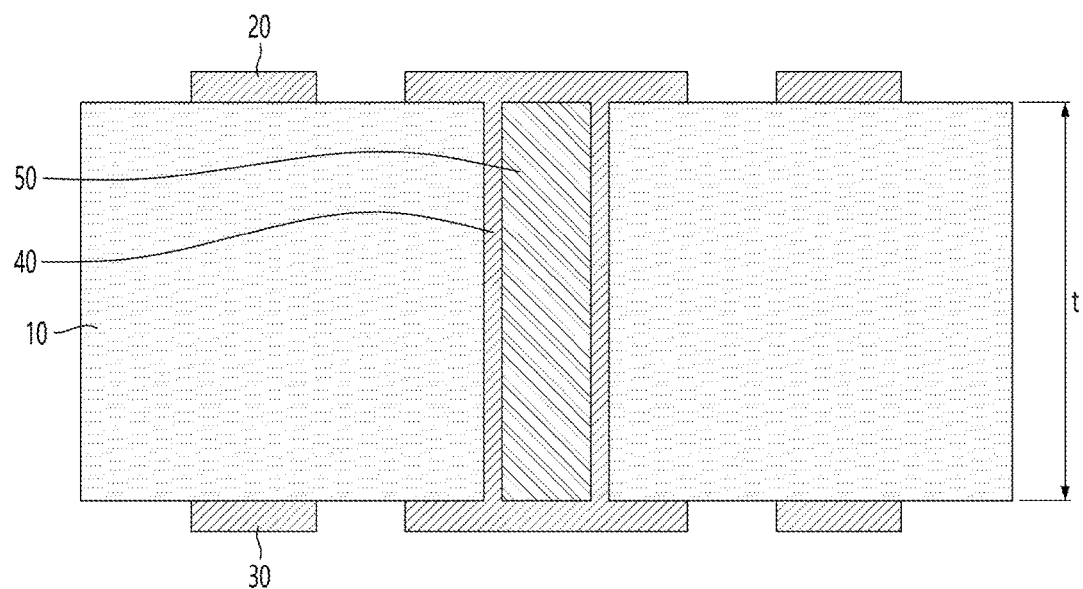
FIG. 1 is a view showing a circuit board according to a comparative example.

FIG. 1 is a view showing a circuit board according to a comparative example. In particular, FIG. 1 is a view showing a core layer in a circuit board of a comparative example.

Hereinafter, problems of a circuit board including a core layer according to a comparative example will be described with reference to FIG. 1.

Before describing the comparative example, high density circuit boards are required along with high functionality of electronic devices and high integration of semiconductor devices. Accordingly, the circuit board has a multilayer structure.

A product to which such a multi-layered circuit board is applied includes FCBGA (Flip Chip Ball Grid Array) or FCCSP (Flip-Chip Chip Scale Package). In addition, a circuit board applied to FCBGA or FCCSP may include a core layer.

In addition, the core layer has a thickness of 200 μm or more to implement multi-layer build-up. In addition, a through electrode for electrical connection of electrode layers of each layer are formed in the core layer. The through electrode may be formed by filling a through hole passing through upper and lower surfaces of the core layer with a conductive material. However, when the core layer has a thickness of 300 μm or more, a process of forming the through hole and/or the through electrode of the comparative Example has the following problems.

The circuit board of the comparative example includes an insulating layer 10, a first electrode layer 20, a second electrode layer 30, and a through electrode layer.

The insulating layer 10 is a core layer and may be a copper clad laminate (CCL). The insulating layer 10 may have a thickness (t) of 200 μm or more. In this case, the through hole formed in the insulating layer 10 having a thickness (t) of 200 μm or more may use any one of the following two methods.

That is, the through hole may be formed by performing a laser process on upper and lower sides of the insulating layer 10, respectively. A vertical cross-sectional shape of the through hole formed by the lase process has an hourglass shape. In other words, when a thickness of the insulating layer 10 exceeds 200 μm, it is difficult to form a through hole passing through the insulating layer 10 only on one of the upper and lower sides of the insulating layer 10. Accordingly, when a through hole is formed in an insulating layer 10 such as a core layer by using a laser, a process of forming the through hole is performed on the upper and lower surfaces of the insulating layer 10, respectively. For example, when a through hole is formed in the insulating layer 10 by the laser process, the through hole is formed by a process of forming a first hole part of the through hole on the upper surface of the insulating layer 10 corresponding to a target hole width and a hole depth that the through hole should have and performing a process of forming a second hole part connected to the first hole part of the through hole on the lower surface of the insulating layer 10.

However, the through hole has an hourglass shape, and accordingly, a width of the through hole decreases as it moves away from the upper and lower surfaces of the insulating layer 10. In this case, a target width of the through hole is determined based on a width at a center where the first hole part and the second hole part are connected. Accordingly, the through hole has a larger width than the target width in a region adjacent to the upper surface of the insulating layer 10 and a region adjacent to the lower surface of the insulating layer 10, and accordingly, there is a problem in that a total area of the through hole is increased. For example, when the target width of the through hole is determined based on the widths of the first hole part and the second hole part, a non-pass problem may occur in which the first hole part and the second hole part are not connected to each other.

Accordingly, in general, when forming a through hole in the insulating layer 10 of the core layer, a CNC (computer numerical control) drill is used. And, when the through hole is formed by the CNC drill, a width of the upper and lower surfaces of the through hole has the same width. That is, the through hole has a columnar shape in which the upper and lower surfaces have the same width.

In this case, when the through hole has a pillar shape, it is difficult to uniformly fill the through hole with a conductive material. That is, when plating is performed to fill a through-hole having a columnar shape, the plating is completed earlier on an outside of the through-hole than on a center of the through-hole, and thus there is a problem in that an empty space (eg, a void) in which plating is not performed exists in the center of the through-hole. In addition, upper and lower surfaces of a through electrode layer formed in the through hole have curved surfaces (eg, concave or convex curved surfaces toward the center of the through hole) rather than a flat surface. In addition, when the upper and lower surfaces of the through electrode layer have curved surfaces, flatness of the substrate is reduced, and thus alignment is reduced during the formation of the additional electrode layer.

In order to solve this problem, in the comparative example, an inside of the through hole is filled using a hole plugging method. Accordingly, the through electrode layer of the circuit board of the comparative example includes a first through electrode 40 formed on an inner wall of the through hole and an insulating member 50 filling the through hole.

Meanwhile, the circuit board of the comparative example includes a first electrode layer 20 disposed on an upper surface of the insulating layer 10. In this case, the first electrode layer 20 is disposed on an upper surface of the insulating layer 10, an upper surface of the first through electrode 40, and an upper surface of the insulating member 50, respectively. For example, the first electrode layer 20 includes a first portion disposed on the upper surface of the insulating layer 10, a second portion disposed on the upper surface of the first through electrode 40, and a third portion disposed on the upper surface of the insulating member 50. In addition, the first to third portions of the first electrode layer 20 have the same thickness as each other.

In addition, the circuit board of the comparative example includes a second electrode layer 30 disposed under a lower surface of the insulating layer 10. In this case, the second electrode layer 30 is disposed under a lower surface of the insulating layer 10, a lower surface of the first through electrode 40, and a lower surface of the insulating member 50, respectively. For example, the second electrode layer 30 includes a first portion disposed under the lower surface of the insulating layer 10, a second portion disposed under the lower surface of the first through electrode 40, and a third portion disposed under the lower surface of the insulating member 50. In addition, the first to third portions of the second electrode layer 30 have the same thickness as each other.

As described above, a thickness of each of the first electrode layer 20 and the second electrode layer 30 in the comparative example increases in proportion to the thickness of the insulating layer 10 by being disposed on the insulating layer 10 having a thickness (t) of 200 μm or more. And, each of the first to third portions of the first electrode layer 20 and the second electrode layer 30 have the same thickness, and accordingly, there is a problem in that a manufacturing cost for forming the first electrode layer 20 and the second electrode layer 30 increases.

Further, in the circuit board of the comparative example, the thickness of the first electrode layer 20 and the thickness of the second electrode layer 30 increase according to the thickness (t) of the insulating layer 10. In addition, as the thickness of the first electrode layer 20 increases, a line width and a space of the first electrode layer 20 also increase. For example, the line width of the first electrode layer 20 of the comparative example exceeds 30 μm, and the space between the plurality of first electrode layers 20 exceeds 30 μm. For example, the line width of the second electrode layer 30 of the comparative example exceeds 30 μm, and the space between the plurality of second electrode layers 30 exceeds 30 μm.

As described above, the comparative example has limitations in miniaturizing the line width and space of the first electrode layer 20 and the second electrode layer 30 disposed on the surface of the insulating layer 10 of the core layer.

Accordingly, the embodiment provides a first electrode layer and a second electrode layer having a thickness variation in the horizontal direction. In addition, the embodiment refines the line width and space of the first electrode layer and the second electrode layer disposed on a surface of the core layer.

Accordingly, the embodiment provides a through electrode formed inside a through hole formed in a core layer having a thickness of 300 μm or more and having improved electrical and physical reliability. For example, the embodiment provides a circuit board including a through electrode having a new structure and a package substrate including the same.

—Electronic Device—

Before describing an embodiment, a package substrate having a structure in which a chip is mounted on a circuit board according to an embodiment may be included in an electronic device.

In this case, the electronic device includes a main board (not shown). The main board may be physically and/or electrically connected to various components. For example, the main board may be connected to a semiconductor package of the embodiment. Various chips may be mounted on the semiconductor package. For example, the semiconductor package may include a memory chip such as a volatile memory (eg, DRAM), a non-volatile memory (eg, ROM), or a flash memory, an application processor chip such as a central processor (eg, CPU), a graphic processor (eg, GPU), a digital signal processor, a cryptographic processor, a microprocessor, or a microcontroller, and a logic chip such as an analog-to-digital converter and an application-specific IC (ASIC).

In addition, the embodiment provides a package substrate capable of mounting at least two chips of different types on one substrate while reducing a thickness of the package substrate connected to the main board of the electronic device.

In this case, the electronic device includes a smart phone, a personal digital assistant, a digital video camera, a digital still camera, a network system, and a computer, a monitor, a tablet, a laptop, a netbook, a television, a video game, a smart watch, an automotive, and the like. However, the embodiment is not limited thereto, and may include any other electronic device that processes data in addition to these.

—Circuit Board—

Figure 2A:
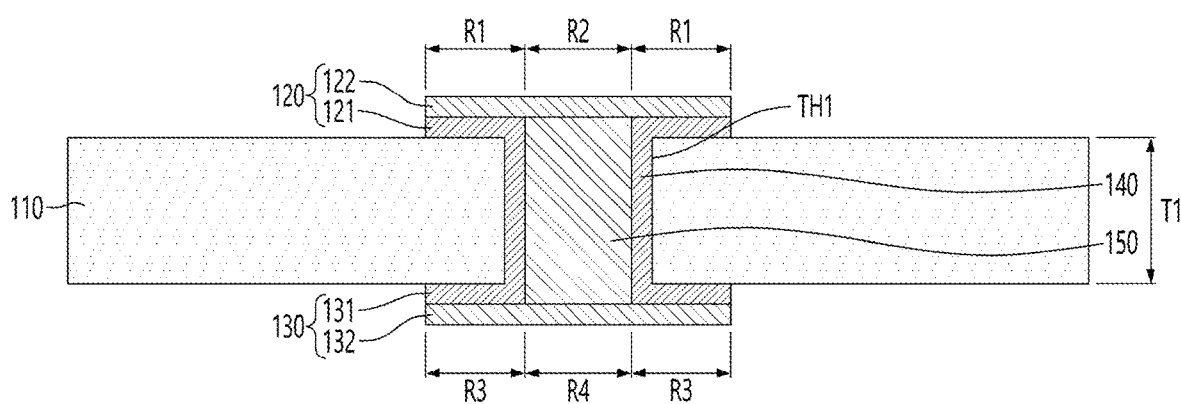
FIG. 2a is a view showing a circuit board according to a first embodiment.

FIG. 2a is a view showing a circuit board according to an embodiment. For example, FIG. 2a is a view showing a part of a core layer in a circuit board according to an embodiment. That is, the core layer of the circuit board of the embodiment is composed of a plurality of insulating layers. And, FIG. 2a may show an insulating layer and an electrode layer disposed in a center of a core layer composed of a plurality of insulating layers.

Referring to FIG. 2a, a circuit board may include a first insulating layer 110, a first electrode layer 120, a second electrode layer 130, a first through electrode 140, and an insulating member 150.

A circuit board of the embodiment may have a multilayer structure. For example, a circuit board of the embodiment may include a plurality of insulating layers. However, FIG. 2 may show a first insulating layer of a plurality of insulating layers constituting a core layer in a circuit board having a multilayer structure.

A first insulating layer 110 may be a core layer. For example, a first insulating layer 110 may be formed of a rigid insulating layer or a copper clad laminate (CCL) in which copper foil is laminated on both sides of an insulating layer.

In particular, a copper clad laminate is a base plate from which circuit boards are generally manufactured. This is a laminated board in which copper foil is clad on an insulating layer. The copper clad laminate may include a glass/epoxy copper clad laminate, a heat resistant resin copper clad laminate, a paper/phenolic copper clad laminate, a copper clad laminate for high frequency use, a flexible copper clad laminate (e.g., polyimide film) and a composite copper clad laminate, etc., depending on a purpose. In this case, a first insulating layer 110 of the embodiment may use a glass/epoxy copper clad laminate for manufacturing a double-sided circuit board and a multi-layer circuit board.

The glass/epoxy copper clad laminate is made of copper foil and a reinforcing substrate in which epoxy resin is infiltrated into glass fibers or organic fibers. The glass/epoxy copper clad laminate is classified according to a reinforcing materials, and in general, grades according to reinforcing materials and heat resistance are determined according to standards determined by NEMA (National Electrical Manufacturers Association), such as FR-1 to FR-5. Here, FR-4 is most commonly used among these grades, but recently, demand for FR-5 with improved glass transition temperature (Tg) characteristics of resins is also increasing.

A first insulating layer 110 may have a certain thickness T1. In this case, the thickness T1 of the first insulating layer 110 may be smaller than the thickness of the core layer of the comparative example. Preferably, the thickness T1 of the first insulating layer 110 may be 150 μm or less. That is, the core layer of the comparative example had a thickness of 200 μm or more. Accordingly, the circuit board of the comparative example had a problem in that the size of the through hole formed in the core layer was increased, and the thickness, line width, and space of the electrode layers disposed on the upper and lower surfaces of the insulating layer were increased.

Accordingly, in the embodiment, a core layer is composed of a plurality of insulating layers, and a thickness T1 of a first insulating layer 110 composed of a copper clad laminate is made to have a thickness T1 of 150 μm or less. Accordingly, in the embodiment, a width of a through hole TH1 passing through the first insulating layer 110 may be reduced according to the decrease in the thickness T1 of the first insulating layer 110. In addition, a thickness, a line width, and a space of each of the first electrode layer 120 and the second electrode layer 130 may be reduced according to the reduction in the thickness T1 of the first insulating layer 110.

Preferably, a thickness T1 of the first insulating layer 110 may range from 80 µm to 150 µm. For example, a thickness T1 of the first insulating layer 110 may range from 90 µm to 148 µm. For example, a thickness of the first insulating layer 110 may range from 100 µm to 145 µm.

When the thickness T1 of the first insulating layer 110 is less than 80 µm, rigidity and warpage properties of the circuit board may deteriorate. In addition, when the thickness T1 of the first insulating layer 110 exceeds 150 µm, a degree of reduction in a width of the through hole formed in the first insulating layer 110 may be insignificant compared to the comparative example. In addition, when the thickness T1 of the first insulating layer 110 exceeds 150 µm, it may be difficult to refine a thickness, a line width, and a space of a first electrode layer 120 and a second electrode layer 130 disposed on the first insulating layer 110.

A first electrode layer 120 is disposed on an upper surface of the first insulating layer 110.

In addition, a second electrode layer 130 is disposed under a lower surface of the first insulating layer 110.

In this case, the first electrode layer 120 and the second electrode layer 130 140 may be formed using additive process, subtractive process, MSAP (Modified Semi Additive Process), and SAP (Semi Additive Process) method, which is a typical circuit board manufacturing process, and a detailed description thereof will be omitted herein. In this case, the first electrode layer 120 and the second electrode layer 130 may have different numbers of layers according to a manufacturing process.

For example, when the first electrode layer 120 and the second electrode layer 130 are manufactured by a SAP method, the first electrode layer 120 and the second electrode layer 130 may have a two-layer structure. In addition, when the first electrode layer 120 and the second electrode layer 130 are manufactured by a MSAP method, the first electrode layer 120 and the second electrode layer 130 may have a three-layer structure including a copper foil layer. However, hereinafter, it will be described that the first electrode layer 120 and the second electrode layer 130 are manufactured by the SAP method. However, embodiments are not limited thereto. For example, when the first electrode layer 120 and the second electrode layer 130 are manufactured by the MSAP method, a first metal layer of each of the first electrode layer 120 and the second electrode layer 130 described below may have a two-layer structure including a copper foil layer and a chemical copper plating layer.

The first electrode layer 120 may be composed of a plurality of layers. For example, the first electrode layer 120 may include a first metal layer 121 disposed on an upper surface of the first insulating layer 110 and a second metal layer 122 disposed on the first metal layer 121.

In addition, the second electrode layer 130 may be composed of a plurality of layers. For example, the second electrode layer 130 may include a third metal layer 131 disposed under a lower surface of the first electrode layer 120 and a fourth metal layer 132 disposed under a lower surface of the third metal layer 131.

The first metal layer 121 and the second metal layer 122 of the first electrode layer 120 and the third metal layer 131 and the fourth metal layer 132 of the second electrode layer 130 may be formed of at least one metal material selected from among gold (Au), silver (Ag), platinum (Pt), titanium (Ti), tin (Sn), copper (Cu), and zinc (Zn). For example, the first metal layer 121 and the second metal layer 122 of the first electrode layer 120 and the third metal layer 131 and the fourth metal layer 132 of the second electrode layer 130 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the first metal layer 121 and the second metal layer 122 of the first electrode layer 120 and the third metal layer 131 and the fourth metal layer 132 of the second electrode layer 130 may be formed of copper (Cu) having high electrical conductivity and a relatively low cost.

In this case, the first metal layer 121 of the first electrode layer 120 and the third metal layer 131 of the second electrode layer 130 has been described as being a separate metal layer to distinguish the first electrode layer 120 and the second electrode layer 130, but is not limited thereto. For example, the first metal layer 121 of the first electrode layer 120, the third metal layer 131 of the second electrode layer 130, and the first through electrode 140 may mean substantially one metal layer. For example, the embodiment forms a chemical copper plating layer by plating an upper surface of the first insulating layer 110, a lower surface of the first insulating layer 110, and an inner wall of the through hole TH1 after forming the through hole TH1 in the first insulating layer 110. In addition, the first metal layer 121 of the first electrode layer 120, the third metal layer 131 of the second electrode layer 130, and the first through electrode 140 may refer to the chemical copper plating layer. However, it is assumed that the first metal layer 121 of the first electrode layer 120, the third metal layer 131 of the second electrode layer 130, and the through electrode 140 are separate metal layers for convenience of description.

Meanwhile, a through electrode layer is disposed in a through hole TH1 passing through the first insulating layer 110. The through electrode layer may refer to a material layer filling the inside of the through hole TH1.

In this case, the through hole TH1 may pass through upper and lower surfaces of the first insulating layer 110. A width of the through hole TH1 in a region adjacent to an upper surface of the first insulating layer 110 may be the same as a width of a through hole TH1 in a region adjacent to a lower surface of the first insulating layer 110. In addition, a width of the through hole TH1 may not change from a region adjacent to an upper surface of the first insulating layer 110 to a region adjacent to a lower surface of the first insulating layer 110. Preferably, the through hole TH1 may have a columnar shape in which a width does not change in a thickness direction or a vertical direction.

In addition, the through electrode layer may be disposed in the through hole TH1 having the columnar shape.

In this case, the through electrode layer includes a first through electrode 140 disposed on an inner wall of the through hole TH1. The first through electrode 140 may include a metal material having electrical conductivity. For example, the first through electrode 140 may be formed of the same metal material as the first metal layer 121 of the first electrode layer 120 and the third metal layer 131 of the second electrode layer 130.

In addition, the through electrode layer may include an insulating member 150 disposed in the through hole TH1. The insulating member 150 may be disposed while filling the inside of the through hole TH1. Preferably, a portion of the through hole TH1 may be filled with the first through electrode 140, and a remaining portion of the through hole TH1 may be filled with the insulating member 150. The insulating member 150 may be formed of plugging ink, which is a paste of an insulating ink material. Accordingly, the insulating member 150 may be referred to as a hole plugging layer. However, the embodiment is not limited thereto, and the insulating member 150 may include a conductive paste containing conductive metal powder.

The insulating member 150 is disposed in the through hole TH1. The insulating member 150 may be surrounded by the first through electrode 140. For example, the first through electrode 140 may surround at least a portion of the insulating member 140. Preferably, the first through electrode 140 may be provided to surround an upper surface, a lower surface and a side surface of the insulating member 140.

The insulating member 150 may protrude upward and downward through the through hole TH1.

For example, an upper surface of the insulating member 150 may be positioned higher than an upper surface of the first insulating layer 110. In addition, a lower surface of the insulating member 150 may be positioned lower than a lower surface of the first insulating layer 110.

In this case, at least a portion of the first electrode layer 120 may contact the insulating member 150. For example, at least a portion of the first electrode layer 120 may vertically overlap the insulating member 150.

In addition, a thickness of the first electrode layer 120 in a region vertically overlapping with the insulating member 150 may be different from a thickness of the first electrode layer 120 in a region that does not vertically overlap with the insulating member 150.

For example, a first metal layer 121 of the first electrode layer 120 is disposed on an upper surface of the first insulating layer 110. In addition, a second metal layer 122 of the first electrode layer 120 is disposed on an upper surface of the first metal layer 121 of the first electrode layer 120 and an upper surface of the insulating member 150.

In this case, the first electrode layer 120 includes a first region R1 that does not vertically overlap with the insulating member 150 and a second region R2 that vertically overlaps with the insulating member 150.

In addition, the first region R1 of the first electrode layer 120 has a multilayer structure including the first metal layer 121 and the second metal layer 122. In addition, the second region R2 of the first electrode layer 120 may include only the second metal layer 122. For example, a number of metal layers in the first region R1 of the first electrode layer 120 may be greater than a number of metal layers in the second region R2 of the first electrode layer 120.

Accordingly, a thickness of the first region R1 of the first electrode layer 120 may be greater than that of the second region R2. Preferably, a thickness of the first electrode layer 120 in a region vertically overlapping with the insulating member 150 may be smaller than a thickness of the first electrode layer 120 in a region that does not vertically overlap with the insulating member 150. Accordingly, the embodiment may reduce a thickness of the first electrode layer 120 in the second region R2 compared to the comparative example. Accordingly, the embodiment can reduce a plating process time for forming the first electrode layer 120, and furthermore, the cost of the plating process can be reduced.

Correspondingly, at least a portion of the second electrode layer 130 may contact the insulating member 150. For example, at least a portion of the second electrode layer 130 may vertically overlap the insulating member 150.

In addition, a thickness of the second electrode layer 130 in a region vertically overlapping with the insulating member 150 may be different from a thickness of the second electrode layer 130 in a region that does not vertically overlap with the insulating member 150.

For example, a third metal layer 131 of the second electrode layer 130 is disposed under a lower surface of the first insulating layer 110. In addition, a fourth metal layer 132 of the second electrode layer 130 is disposed under a lower surface of the third metal layer 131 of the second electrode layer 130 and a lower surface of the insulating member 150.

In this case, the second electrode layer 130 includes a third region R3 that does not vertically overlap with the insulating member 150 and a fourth region R4 that vertically overlaps with the insulating member 150.

In addition, the third region R3 of the second electrode layer 130 has a multilayer structure including the third metal layer 131 and the fourth metal layer 132. In addition, the fourth region R4 of the second electrode layer 130 may include only the fourth metal layer 132. For example, a number of metal layers in the third region R3 of the second electrode layer 130 may be greater than a number of metal layers in the fourth region R4 of the second electrode layer 130.

Accordingly, a thickness of the third region R3 of second electrode layer 130 may be greater than that of the fourth region R4. Preferably, a thickness of the second electrode layer 130 in a region vertically overlapping with the insulating member 150 may be smaller than a thickness of the second electrode layer 130 in a region that does not vertically overlap with the insulating member 150. Accordingly, the embodiment may reduce a thickness of second electrode layer 130 in the fourth region R4 compared to the comparative example. Accordingly, the embodiment can reduce a plating process time for forming the second electrode layer 130, and furthermore, the cost of the plating process can be reduced.

Figure 2B:
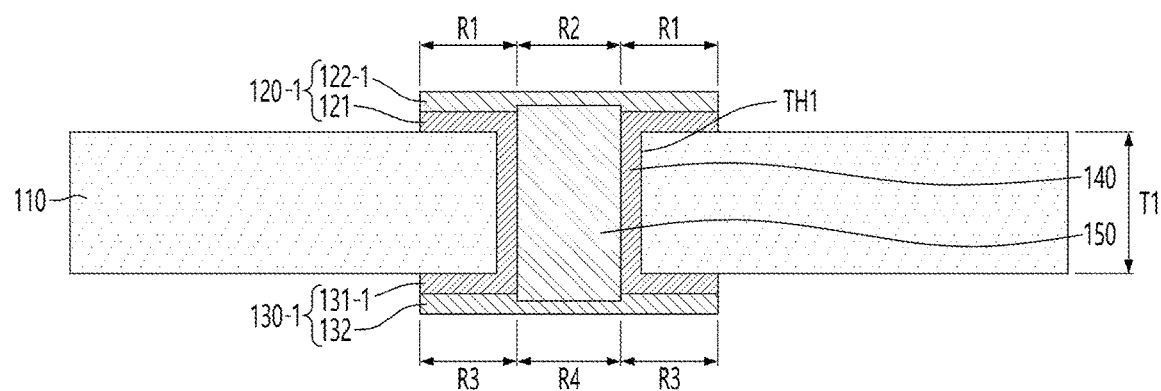
FIG. 2b is a view showing a circuit board according to a second embodiment.

FIG. 2b is a view showing a circuit board according to a second embodiment.

Referring to FIG. 2b, a basic structure of a circuit board is the same as that of FIG. 2a.

However, FIG. 2b may have a difference in a structure of an electrode layer compared to FIG. 2a.

A first electrode layer 120-1 may have a multi-layer structure. The first electrode layer 120-1 may include a first metal layer 121 disposed on an upper surface of the first insulating layer 110 and a second metal layer 122-1 disposed on the first metal layer 121.

In this case, the first region R1 and the second region R2 of the first metal layer 121 of the first electrode layer 120 of the first embodiment have different thicknesses, and the first region R1 and the second region R2 of the second metal layer 122 of the first electrode layer 120 of the first embodiment have the same thickness.

Differently, the first region R1 and the second region R2 of the first electrode layer 120-1 of the second embodiment may have different thicknesses, and the first region R1 and the second region R2 of the second metal layer 122-1 may also have different thicknesses.

For example, a thickness of the first region R1 of the second metal layer 122-1 may be greater than a thickness of the second region R2 of the second metal layer 122-1. For example, an upper surface of the insulating member 150 may be positioned higher than an upper surface of the first metal layer 121 of the first electrode layer 120-1.

Accordingly, a lower surface of the second metal layer 122-1 of the first electrode layer 120-1 may have a step. For example, a lower surface of the second metal layer 122-1 of the first electrode layer 120-1 vertically overlapping the insulating member 150 may be positioned higher than a lower surface of the second metal layer 122-1 of the first electrode layer 120-1 that does not vertically overlap with the insulating member 150.

For example, a lower surface of the second metal layer 122-1 may include a concave portion that is concave toward the insulating member 150. For example, a lower surface of the second metal layer 122-1 may include a convex portion that is convex toward an upper surface of the second metal layer 122-1.

In addition, the second electrode layer 130-1 may have a multi-layer structure. The second electrode layer 130-1 may include a third metal layer 131 disposed under a lower surface of the first insulating layer 110 and a fourth metal layer 132-1 disposed on the third metal layer 131.

In this case, the third region R3 and the fourth region R4 of the third metal layer 131 of the second electrode layer 130 of the first embodiment have different thicknesses, and the third region R3 and the fourth region R4 of the fourth metal layer 132 have the same thickness.

Differently, the third region R3 and the fourth region R4 of the second electrode layer 120-1 of the second embodiment may have different thicknesses, and the third region R3 and the fourth region R4 of the fourth metal layer 132-1 may also have different thicknesses.

For example, a thickness of the third region R3 of the fourth metal layer 132-1 may be greater than a thickness of the fourth region R4 of the fourth metal layer 132-1. For example, a lower surface of the insulating member 150 may be positioned lower than a lower surface of the third metal layer 131 of the second electrode layer 130-1.

Accordingly, an upper surface of the fourth metal layer 132-1 of the second electrode layer 130-1 may have a step. For example, an upper surface of the fourth metal layer 132-1 of the second electrode layer 130-1 vertically overlapping the insulating member 150 may be positioned lower than an upper surface of the fourth metal layer 132-1 of the second electrode layer 130-1 that does not vertically overlap with the insulating member 150.

For example, an upper surface of the fourth metal layer 132-1 may include a concave portion that is concave toward the insulating member 150. For example, an upper surface of the fourth metal layer 132-1 may include a convex portion that is convex toward a lower surface of the fourth metal layer 122-1.

Hereinafter, an entire layer structure of a core layer in the circuit board according to the embodiment will be described. Specifically, a first insulating layer, a first electrode layer, a second electrode layer, a first through electrode, and an insulating member shown in FIG. 2a or 2b may form some of an entire layers of a core layer of the circuit board.

Figure 3:
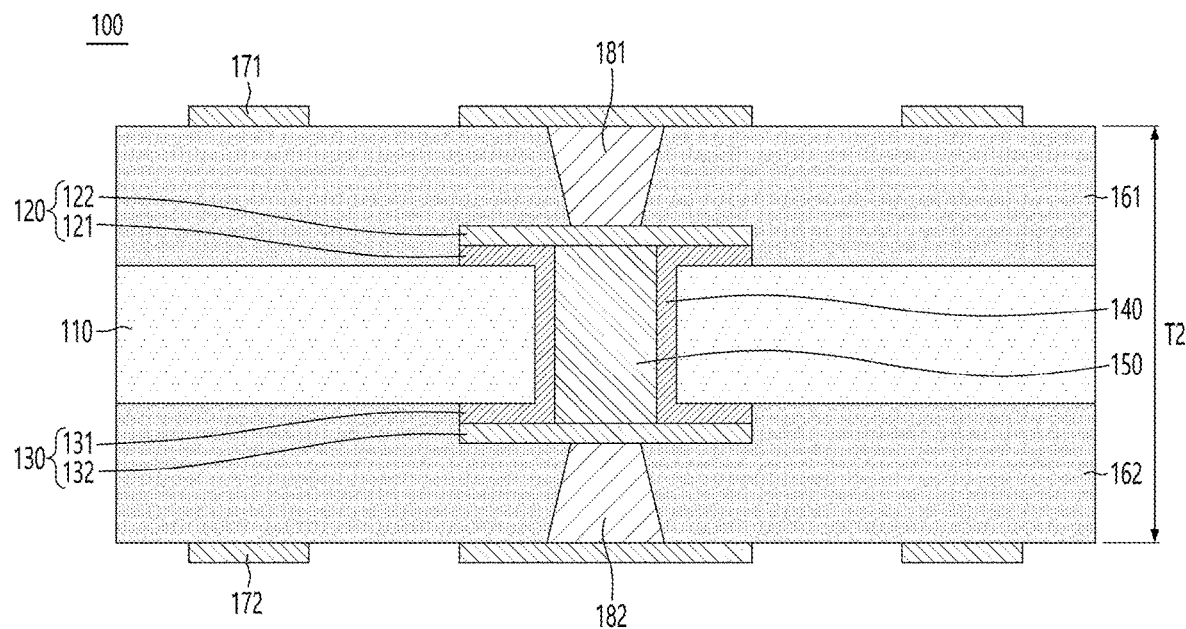
FIG. 3 is a view showing an entire layer structure of the core layer in a circuit board according to an embodiment.

FIG. 3 is a view showing an entire layer structure of a core layer in a circuit board according to an embodiment.

Referring to FIG. 3, a circuit board according to an embodiment includes a core layer 100. In this case, the core layer 100 may mean a core substrate.

Preferably, the circuit board shown in FIG. 2a may represent some layers of the core board. For example, the circuit board of FIG. 2a may represent a central layer in an entire layer structure of the core board.

However, the entire layer structure of the circuit board described below is not limited to that of FIG. 3, and the circuit board may be manufactured by applying a structure of the core layer 100-1 of FIG. 2b instead of FIG. 2a.

The embodiment includes a core layer of a multi-layer structure rather than a core layer of a single-layer copper-clad laminate of the comparative example.

For example, a core layer 100 of the circuit board according to the embodiment may include a plurality of insulating layers. Also, a total thickness T2 of the plurality of insulating layers may correspond to the thickness (t) of the insulating layer 10 of the comparative example. Through this, the embodiment can reduce a thickness, a line width and a space of the electrode layer formed on the core layer. Accordingly, in the embodiment, it is possible to miniaturize the electrode layer disposed on a surface of the core layer 100 in the circuit board including the core layer 100.

That is, a core layer 100 of the circuit board of the embodiment includes a first insulating layer 110, a first electrode layer 120, a second electrode layer 130, a first through electrode 140, and an insulating member 150.

In addition, a core layer 100 of the circuit board includes a second insulating layer 161 disposed on the first insulating layer 110. In addition, a core layer 100 of the circuit board includes a third insulating layer 162 disposed under the first insulating layer 110.

That is, a core layer 100 of the embodiment includes a first insulating layer 110, a second insulating layer 161, and a third insulating layer 162.

In this case, the second insulating layer 161 and the third insulating layer 162 may be prepreg. Alternatively, the second insulating layer 161 and the third insulating layer 162 may be ABF (Ajinomoto Build-up Film).

That is, some layers of the core layer 100 of the embodiment are formed of a copper clad laminate, and some other layers of the core layer 100 are formed of prepreg or ABF. Accordingly, an electrode layer serving as substantial signal transmission lines are disposed on an upper surface of the second insulating layer 161 and a lower surface of the third insulating layer 162 of the core layer 100.

In other words, the first electrode layer 120 and the second electrode layer 130 function as through electrode layers for transmitting signals between layers. Accordingly, the first electrode layer 120 is disposed to correspond to a region where the first through electrode 140 is disposed on the upper surface of the first insulating layer 110. In addition, the first electrode layer 120 may not be disposed in a region where the first through electrode 140 is not disposed. For example, a normal electrode layer includes a pad and a trace. The trace is also disposed on a region of the upper surface of the first insulating layer 110 where the first through electrode 140 is not disposed. Alternatively, the first electrode layer 120 according to the embodiment may be selectively disposed only in a region where the first through electrode 140 is disposed. Correspondingly, the second electrode layer 130 may be disposed to correspond to a region where the first through electrode 140 is disposed under the lower surface of the first insulating layer 110.

Meanwhile, the circuit board may include a second through electrode 181 passing through the second insulating layer 161. The second through electrode 181 may be formed by filling a through hole passing through the second insulating layer 161 with a conductive material. In this case, a through hole formed in the second insulating layer 161 may have a different shape from the through hole TH1 formed in the first insulating layer 110. Preferably, a through hole formed in the second insulating layer 161 may have an inclination in which a width gradually decreases from an upper surface to a lower surface of the second insulating layer 161. For example, a through hole formed in the second insulating layer 161 may have a trapezoidal shape in which a width of an upper surface is greater than a width of a lower surface.

In this case, the second through electrode 181 may vertically overlap the first through electrode 140. Preferably, the second through electrode 181 may be disposed in a region vertically overlapping the first through electrode 140 among an entire region of the second insulating layer 161. In other words, the second through electrode 181 may not be disposed in a region of the second insulating layer 161 that does not vertically overlap the first through electrode 140. This is because the core layer of the embodiment includes the first insulating layer 110, the second insulating layer 161, and the third insulating layer 162.

In addition, the circuit board may include a third through electrode 182 passing through the third insulating layer 162. The third through electrode 182 may be formed by filling a through hole passing through the third insulating layer 162 with a conductive material. In this case, a through hole formed in the third insulating layer 162 may have a different shape from the through hole TH1 formed in the first insulating layer 110. Preferably, a through hole formed in the third insulating layer 162 may have an inclination in which a width gradually decreases from a lower surface to an upper surface of the third insulating layer 162. For example, a through hole formed in the third insulating layer 162 may have a trapezoidal shape where a width of a lower surface is greater than a width of an upper surface.

In this case, the third through electrode 182 may vertically overlap the first through electrode 140. Preferably, the third through electrode 182 may be disposed in a region vertically overlapping the first through electrode 140 among an entire region of the third insulating layer 162. In other words, the third through electrode 182 may not be disposed in a region of the third insulating layer 162 that does not vertically overlap the first through electrode 140.

In conclusion, the first through electrode 140, the second through electrode 181, and the third through electrode 182 of the embodiment may be vertically overlapped with each other.

For example, when the plurality of first through electrodes 140 disposed in the first insulating layer 110 are disposed, the plurality of first through electrodes 140 may vertically overlap each of the plurality of second through electrodes 181 and the plurality of third through electrodes 182.

For example, when the plurality of second through electrodes 181 are disposed in the second insulating layer 161, the plurality of second through electrodes 181 may vertically overlap each of the plurality of first through electrodes 140 and the plurality of third through electrode 182.

For example, when the plurality of third through electrodes 182 are disposed in the third insulating layer 162, the plurality of third through electrodes 182 may vertically overlap each of the plurality of first through electrodes 140 and the plurality of second through electrodes 181.

Accordingly, a through electrode passing through the core layer of the embodiment may have a plurality of layer structure. For example, the through electrode passing through the core layer of the comparative example includes a first through electrode and an insulating member.

Unlike this, a through electrode passing through the core layer of the embodiment may include a first through electrode 140, an insulating member 150, a first electrode layer 120, a second electrode layer 130, a second through electrode 181, and a third through electrode 182.

Meanwhile, a third electrode layer 171 is disposed on an upper surface of the second insulating layer 161. In addition, a fourth electrode layer 172 is disposed under a lower surface of the third insulating layer 162.

In this case, a third electrode layer 171 according to the embodiment may mean a signal wire disposed on an upper surface of the core layer. In the comparative example, a line width of the first electrode layer disposed on an upper surface of the core layer exceeded 30 μm, and a space between the plurality of first electrode layers exceeded 30 μm. Alternatively, a line width of the third electrode layer 171 disposed on the upper surface of the core layer according to the embodiment may have a range of 5 μm to 15 μm. For example, the line width of the third electrode layer 171 disposed on the upper surface of the core layer of the embodiment may have a range of 6 μm to 13 μm. For example, the line width of the third electrode layer 171 disposed on the upper surface of the core layer of the embodiment may have a range of 7 μm to 12 μm. This is because the core layer of the embodiment is not composed of a copper clad laminate, but is composed of a combination of a copper clad laminate and prepreg or ABF.

In addition, a space between the plurality of third electrode layers 171 disposed on the upper surface of the core layer of the embodiment may have a range of 5 μm to 20 μm. For example, the space between the plurality of third electrode layers 171 disposed on the upper surface of the core layer of the embodiment may have a range of 6 μm to 19 μm. For example, the space between the plurality of third electrode layers 171 disposed on the upper surface of the core layer of the embodiment may have a range of 7 μm to 18 μm. This is because the core layer of the embodiment is not composed of only the copper clad laminate, but is composed of a combination of the copper clad laminate and prepreg or ABF.

Correspondingly, a line width of a fourth electrode layer 172 disposed under a lower surface of the core layer of the embodiment may have a range of 5 μm to 15 μm. For example, the line width of the fourth electrode layer 172 disposed under the lower surface of the core layer of the embodiment may have a range of 6 μm to 13 μm. For example, the line width of the fourth electrode layer 172 disposed under the lower surface of the core layer of the embodiment may have a range of 7 μm to 12 μm. This is because the core layer of the embodiment is not composed of a copper clad laminate, but is composed of a combination of a copper clad laminate and prepreg or ABF.

In addition, a space between the plurality of fourth electrode layers 172 disposed under the lower surface of the core layer of the embodiment may have a range of 5 μm to 20 μm. For example, the space between the plurality of fourth electrode layers 172 disposed under the lower surface of the core layer of the embodiment may have a range of 6 μm to 19 μm. For example, the space between the plurality of fourth electrode layers 172 disposed under the lower surface of the core layer of the embodiment may have a range of 7 μm to 18 μm. This is because the core layer of the embodiment is not composed of only the copper clad laminate, but is composed of a combination of the copper clad laminate and prepreg or ABF.

As described above, a core layer of the circuit board is not composed of only a copper clad laminate, but is composed of a combination of the copper clad laminate and prepreg or ABF. Accordingly, the embodiment can reduce a thickness of an electrode layers disposed on an upper surface and a lower surface of the core layer of the circuit board. In addition, the embodiment can reduce a line width and a space of the electrode layer disposed on the upper and lower surfaces of the core layer of the circuit board. Accordingly, in the embodiment, it is possible to miniaturize the electrode layers disposed on the upper and lower surfaces of the core layer, and accordingly, an overall thickness of the circuit board can be reduced.

Figure 4:
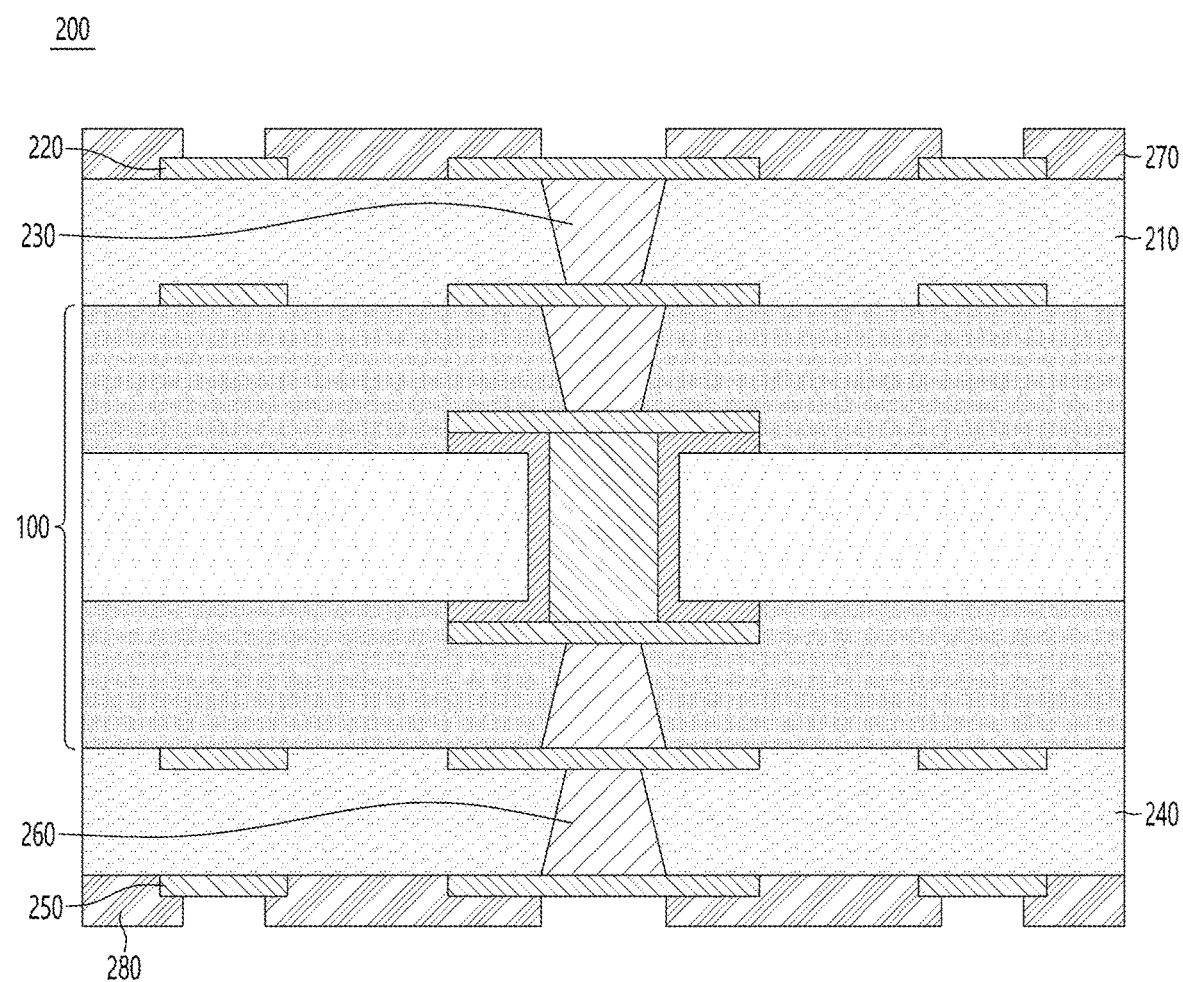
FIG. 4 is a view showing an entire layer structure of a circuit board according to an embodiment.

FIG. 4 is a view showing an entire layer structure of a circuit board according to an embodiment.

Referring to FIG. 4, the circuit board may include a core layer 100 described in FIG. 3. In addition, the circuit board of the embodiment may further include an insulating layer and an electrode layer disposed on at least one surface of the core layer 100.

For example, the circuit board of the embodiment may have a multilayer structure.

For example, the circuit board 200 according to the embodiment may include a fourth insulating layer 210 disposed on an upper surface of the core layer 100.

In addition, the circuit board 200 according to the embodiment may include a fifth insulating layer 220 disposed under a lower surface of the core layer 100.

In addition, a circuit board 200 of the embodiment includes a fifth electrode layer 220 disposed on an upper surface of the fourth insulating layer 210. In addition, a circuit board 200 according to the embodiment includes a fourth through electrode 230 passing through the fourth insulating layer 210. In this case, the fourth through electrode 230 may vertically overlap the first through electrode 140, the second through electrode 181, and the third through electrode 182 of the core layer 100. In addition, the fourth through electrode 230 may not vertically overlap the first through electrode 140, the second through electrode 181, and the third through electrode 182 of the core layer 100. That is, the first through electrode 140, the second through electrode 181, and the third through electrode 182 disposed on the core layer 100 are all vertically overlapped. This is because the through electrode disposed on the core layer 100 is constituted by a combination of the first through electrode 140, the second through electrode 181, and the third through electrode 182.

In addition, the fourth through electrode 230 may include a 4-1 through electrode vertically overlapping the first through electrode 140, the second through electrode 181, and the third through electrode 182. In addition, the fourth through electrode 230 may include a 4-2 through electrode that does not vertically overlap the first through electrode 140, the second through electrode 181, and the third through electrode 182. In this case, the 4-2 through electrode may vertically overlap the third electrode layer 171 of the core layer 100.

In addition, a circuit board 200 of the embodiment includes a sixth electrode layer 250 disposed under a lower surface of the fifth insulating layer 220. In addition, a circuit board 200 according to the embodiment includes a fifth through electrode 250 passing through the fifth insulating layer 220. In this case, the fifth through electrode 250 may vertically overlap the first through electrode 140, the second through electrode 181, and the third through electrode 182 of the core layer 100. In addition, the fifth through electrode 250 may not vertically overlap the first through electrode 140, the second through electrode 181, and the third through electrode 182 of the core layer 100.

That is, the fifth through electrode 250 may include a 5-1 through electrode vertically overlapping the first through electrode 140, the second through electrode 181, and the third through electrode 182. In addition, the fifth through electrode 250 may include a 5-2 through electrode that does not vertically overlap the first through electrode 140, the second through electrode 181, and the third through electrode 182. In this case, the 5-2 through electrode may vertically overlap the fourth electrode layer 172 of the core layer 100.

Meanwhile, a circuit board 200 may include a first protective layer 270 disposed on an upper surface of the fourth insulating layer 210 and a second protective layer 280 disposed under a lower surface of the fifth insulating layer 220.

The first protective layer 270 may include an opening (not shown) vertically overlapping an upper surface of the fifth electrode layer 220. In addition, the second protective layer 280 may include an opening (not shown) vertically overlapping an lower surface of the sixth electrode layer 250.

The first protective layer 270 and the second protective layer 280 may be a resist layer. For example, the first protective layer 270 and the second protective layer 280 may be a solder resist layer including an organic polymer material. For example, the first protective layer 270 and the second protective layer 280 may include an epoxy acrylate-based resin. In detail, the first protective layer 270 and the second protective layer 280 may include a resin, a curing agent, a photo initiator, a pigment, a solvent, a filler, an additive, an acrylic monomer, and the like. However, the embodiment is not limited thereto, and the first protective layer 270 and the second protective layer 280 may be any one of a photo solder resist layer, a cover-lay, and a polymer material.

The first protective layer 270 and the second protective layer 280 may have a thickness of 1 μm to 20 μm. The first protective layer 270 and the second protective layer 280 may have a thickness of 1 μm to 15 μm. For example, the thickness of the first protective layer 270 and the second protective layer 280 may be 5 μm to 20 μm. When the thickness of the first protective layer 270 and the second protective layer 280 exceeds 20 μm, a thickness of the circuit board may increase. When the thicknesses of the first protective layer 270 and the second protective layer 280 are less than 1 μm, electrical reliability or physical reliability may be deteriorated because the electrode layers included in the circuit board are not stably protected.

A circuit board of an embodiment includes a through electrode layer passing through a first insulating layer and a first electrode layer disposed on the first insulating layer. In this case, the through electrode layer includes a first through electrode disposed on an inner wall of a first through hole and an insulating member passing through the first insulating layer. The first electrode layer includes a first region R1 that does not vertically overlap the insulating member and a second region R2 that vertically overlaps the insulating member. The first region R1 of the first electrode layer has a multilayer structure including a first metal layer and a second metal layer. The second region R2 of the first electrode layer may include only the second metal layer. For example, a number of metal layers in the first region R1 of the first electrode layer may be greater than a number of metal layers in the second region R2 of the first electrode layer.

Accordingly, a thickness of the first region R1 of the first electrode layer may be greater than that of the second region R2. Preferably, a thickness of the first electrode layer in a region vertically overlapping with the insulating member may be smaller than a thickness of the first electrode layer in a region not vertically overlapping with the insulating member. Accordingly, the embodiment may reduce a thickness of the first electrode layer in the second region R2 compared to a comparative example. Accordingly, the embodiment can reduce a plating process time for forming the first electrode layer, and further reduce a cost in the plating process.

As described above, a core layer of the circuit board is not composed of only a copper clad laminate, but is composed of a combination of the copper clad laminate and prepreg or ABF. Accordingly, the embodiment can reduce a thickness of an electrode layers disposed on an upper surface and a lower surface of the core layer of the circuit board. In addition, the embodiment can reduce a line width and a space of the electrode layer disposed on the upper and lower surfaces of the core layer of the circuit board. Accordingly, in the embodiment, it is possible to miniaturize the electrode layers disposed on the upper and lower surfaces of the core layer, and accordingly, an overall thickness of the circuit board can be reduced.

Figure 5:
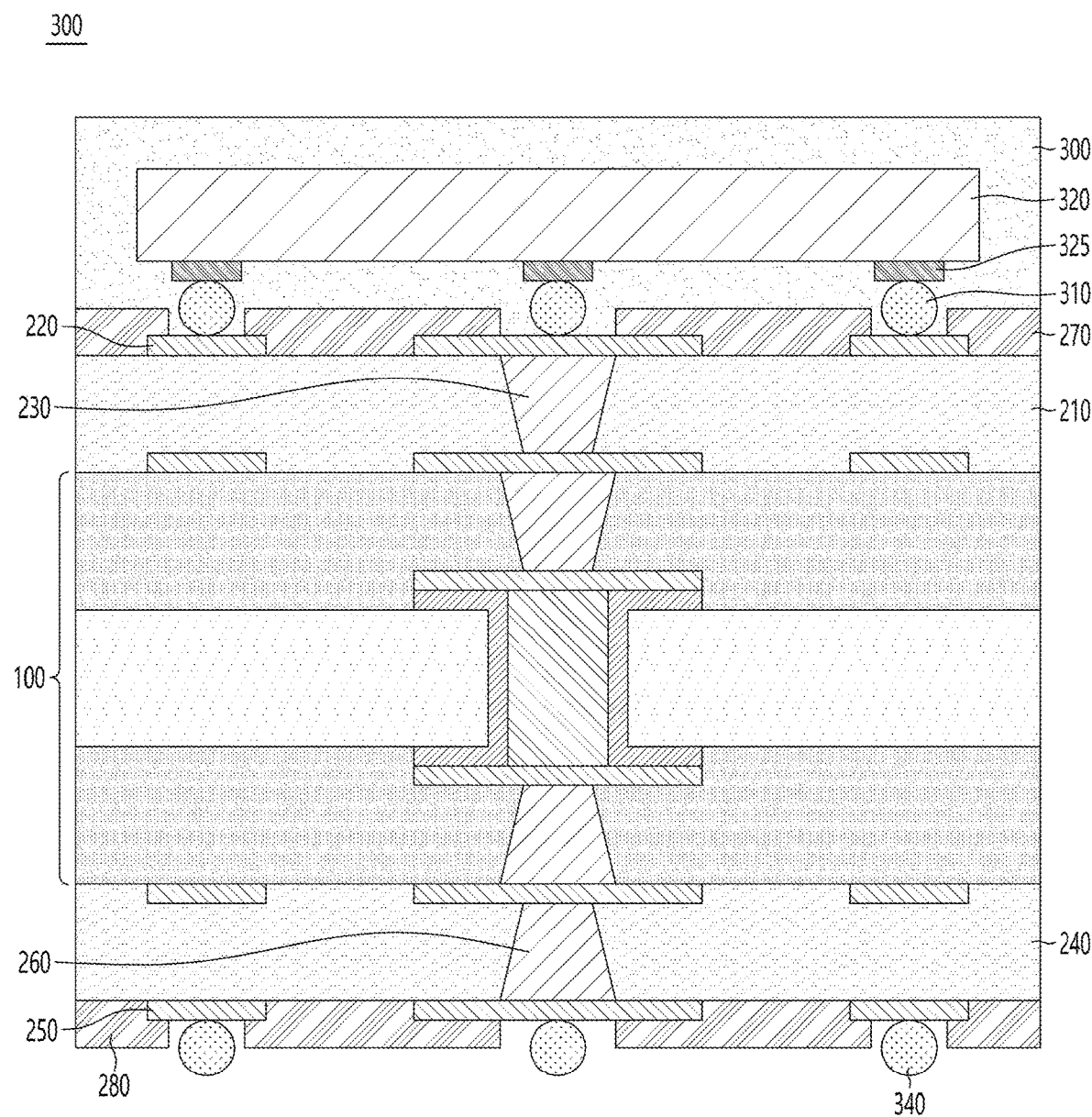
FIG. 5 is a view showing a semiconductor package according to an embodiment.

FIG. 5 is a view showing a semiconductor package according to an embodiment.

Referring to FIG. 5, a semiconductor package according to an embodiment includes a circuit board of FIG. 4, at least one chip mounted on the circuit board, a molding layer for molding the chip, and a connection portion for connecting the chip or an external substrate.

For example, the semiconductor package according to the embodiment may include a first connection portion 310 disposed on the fifth electrode layer 220 which is an outermost electrode layer of the circuit board. A cross section of the first connection portion 310 may include a circular shape or a semicircular shape. For example, a cross section of the first connection portion 310 may have a partially or entirely rounded shape. A cross-sectional shape of the first connection portion 310 may be a flat surface on one side and a curved surface on the other side. The first connection portion 310 may be a solder ball, but is not limited thereto.

Meanwhile, the embodiment may include a chip 320 disposed on the first connection portion 310. The chip 320 may be a processor chip. For example, the chip 320 may be an application processor (AP) chip including a central processor (eg, CPU), a graphic processor (eg, GPU), a digital signal processor, a cryptographic processor, a microprocessor, and a microcontroller. A terminal 325 of the chip 320 may be connected to the fifth electrode layer 220 through the first connection portion 310. For example, the fifth electrode layer 220 may include a mounting pad on which the chip 220 is mounted.

Also, although not shown in the drawing, the semiconductor package according to the embodiment may further include an additional chip. For example, in the semiconductor package according to the embodiment, at least two chips of a central processor (eg, CPU), a graphic processor (eg, GPU), a digital signal processor, a cryptographic processor, a microprocessor, and a microcontroller may be disposed on the circuit board at a predetermined interval. For example, the chip 320 in the embodiment may include a central processor chip and a graphic processor chip, but is not limited thereto.

Meanwhile, the plurality of chips may be spaced apart from each other on the circuit board at the predetermined interval. For example, the interval between the plurality of chips may be 150 μm or less. For example, the interval between the plurality of chips may be 120 μm or less. For example, the interval between the plurality of chips may be 100 μm or less.

Preferably, the interval between the plurality of chips may have a range of 60 μm to 150 μm. Preferably, the interval between the plurality of chips may have a range of 70 μm to 120 μm. Preferably, the interval between the plurality of chips may have a range of 80 μm to 110 μm. When the interval between the plurality of chips is less than 60 μm, a problem may occur in operation reliability due to mutual interference between the plurality of chips. When the interval between the plurality of chips is greater than 150 μm, signal transmission loss may increase as the interval between the plurality of chips increases. When the interval between the plurality of chips is greater than 150 μm, a volume of the semiconductor package may increase.

The semiconductor package may include a molding layer 330. The molding layer 330 may be disposed while covering the chip 320. For example, the molding layer 330 may be EMC (Epoxy Mold Compound) formed to protect the mounted chip 320, but is not limited thereto.

In this case, the molding layer 330 may have a low dielectric constant in order to increase heat dissipation properties. For example, a dielectric constant (Dk) of the molding layer 330 may be 0.2 to 10. For example, the dielectric constant (Dk) of the molding layer 330 may be 0.5 to 8. For example, the dielectric constant (Dk) of the molding layer 330 may be 0.8 to 5. Accordingly, in the embodiment, the molding layer 330 has a low dielectric constant, so that heat dissipation properties for heat generated from the chip 320 can be improved.

Meanwhile, the semiconductor package may include a second connection portion 240 disposed on a lowermost side of the circuit board. The second connection portion 240 may be disposed on a lower surface of the sixth electrode layer 250 vertically overlapping the opening of the second protective layer 280.

—Manufacturing Method—

Hereinafter, a method of manufacturing the circuit board shown in FIG. 3 according to an exemplary embodiment will be described in a process order. Preferably, the manufacturing method of the core layer 100 of the circuit board according to the embodiment will be described in the process order below.

FIGS. 6 to 16 are views for explaining a manufacturing method of a circuit board according to the embodiment shown in FIG. 3 in process order.

Figure 6:
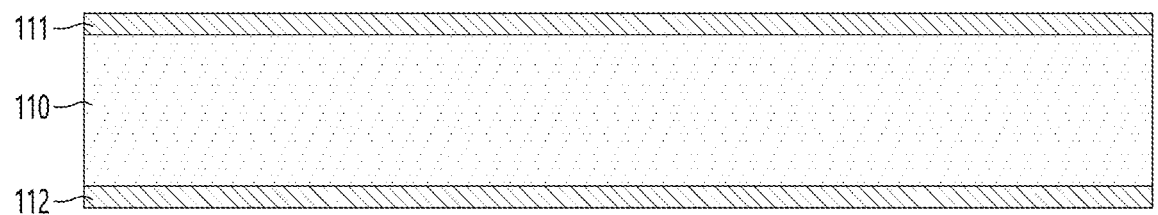
FIGS. 6 to 16 are views for explaining a manufacturing method of a circuit board according to the embodiment shown in FIG. 3 in process order.

Referring to FIG. 6, the embodiment prepares a copper clad laminate that is the basis for manufacturing the core layer 100. In this case, the copper clad laminate includes a first insulating layer 110. In addition, the copper clad laminate includes a copper foil layer disposed on a surface of the first insulating layer 110. For example, the copper clad laminate may include a first copper foil layer 111 disposed on an upper surface of the first insulating layer 110 and a second copper foil layer 112 disposed under a lower surface of the first insulating layer 110.

Figure 7:
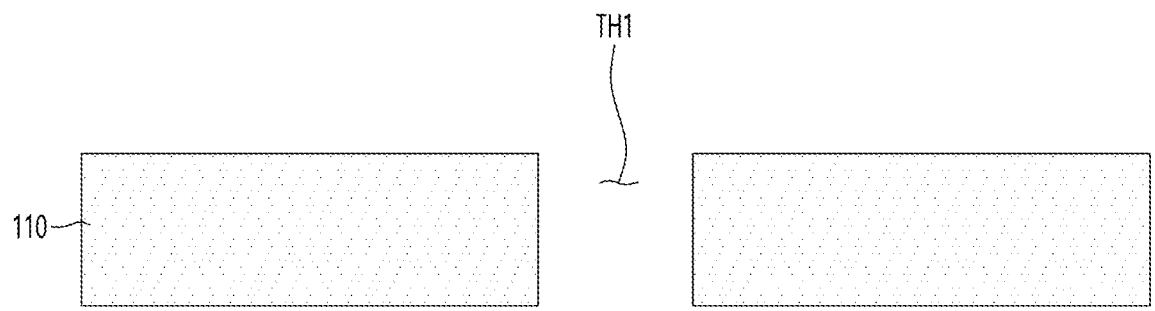

Next, referring to FIG. 7, the embodiment may proceed with a process of removing the first copper foil layer 111 and the second copper foil layer 112 from the prepared copper clad laminate. In this case, the removing process of the first copper foil layer 111 and the second copper foil layer 112 may be selectively performed according to the manufacturing method of an electrode layer of the core layer. For example, the electrode layer of the core layer 100 may be manufactured using the first copper foil layer 111 and the second copper foil layer 112. And, when the electrode layer is manufactured using the first copper foil layer 111 and the second copper foil layer 112, the removing process of the first copper foil layer 111 and the second copper foil layer 112 may be omitted. Hereinafter, a method for manufacturing an electrode layer in a state in which the first copper foil layer 111 and the second copper foil layer 112 are removed will be mainly described. The embodiment may proceed with a process of forming a through hole TH1 passing through the first insulating layer 110 when the first copper foil layer 111 and the second copper foil layer 112 are removed.

Figure 8:
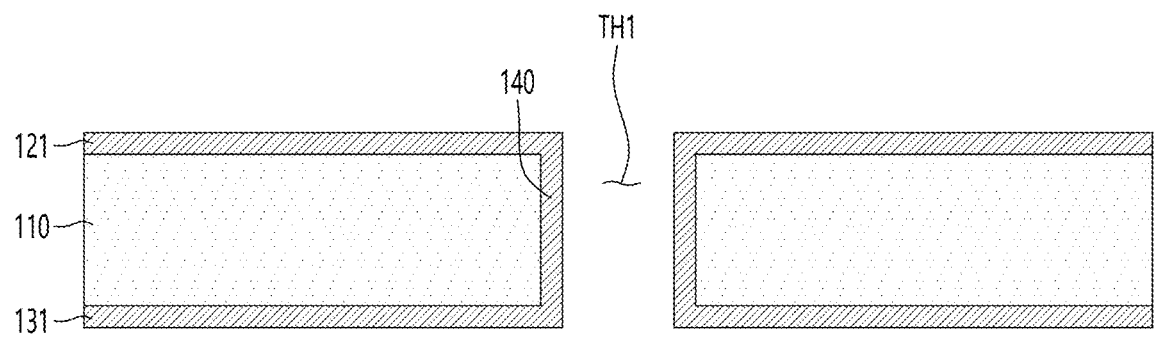

Next, referring to FIG. 8, the embodiment may proceed with a process of forming a metal layer on the upper surface of the first insulating layer 110, the lower surface of the first insulating layer 110, and the inner wall of the through hole TH1. In this case, the formed metal layer may include a first metal layer 121 constituting a first electrode layer 120, a third metal layer 131 constituting a second electrode layer 130, and the first through electrode 140.

Figure 9:
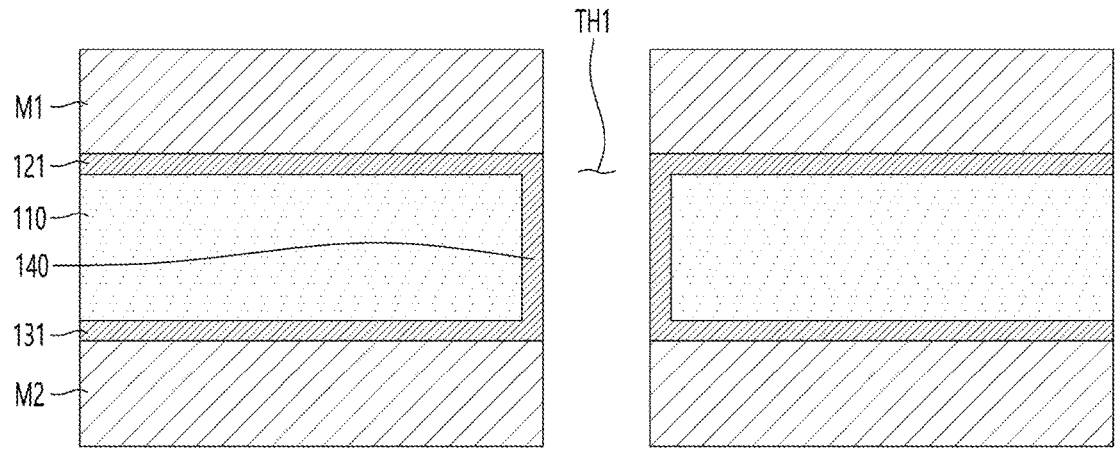

Next, referring to FIG. 9, the embodiment may proceed with a process of forming a mask on upper and lower sides of the first insulating layer 110. For example, the embodiment may proceed with a process of forming a first mask M1 on the upper side of the first insulating layer 110. The first mask M1 may be disposed on the first metal layer 121 of the first electrode layer 120. In this case, the first mask M1 may include an opening (not shown) vertically overlapping a through hole TH1 passing through the first insulating layer 110.

In addition, the embodiment may proceed with a process of forming a second mask M2 on the lower side of the first insulating layer 110. The second mask M2 may be disposed under the third metal layer 131 of the second electrode layer 130. In this case, the second mask M2 may include an opening (not shown) vertically overlapping the through hole TH1 penetrating the first insulating layer 110.

Figure 10:
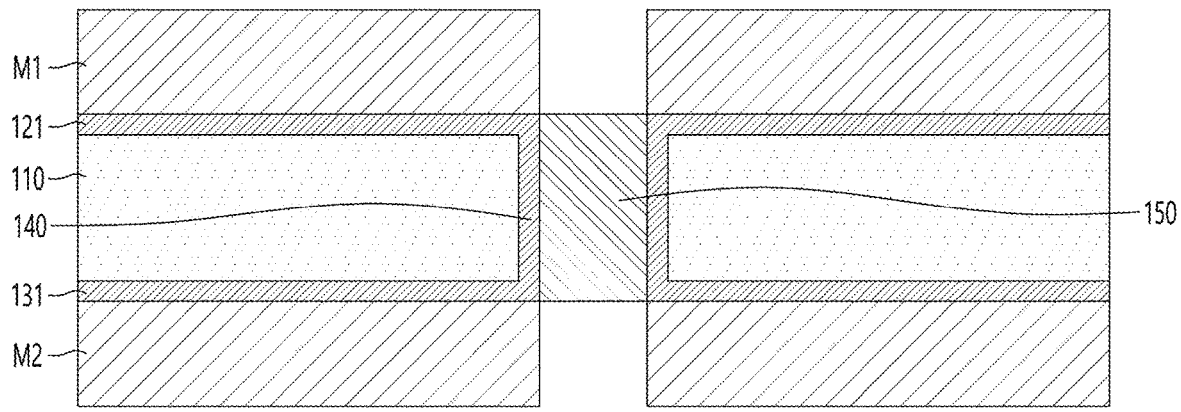

Next, referring to FIG. 10, the embodiment proceed with a hole-plugging process of forming an insulating member 150 in the through hole TH1 vertically overlapping the openings of the first mask M1 and the second mask M2. In this case, an upper surface of the insulating member 150 may be formed to be positioned higher than an upper surface of the first insulating layer 110. In addition, a lower surface of the insulating member 150 may be positioned lower than a lower surface of the first insulating layer 110.

For example, an upper surface of the insulating member 150 may be formed to be positioned on the same plane as an upper surface of the first metal layer 121 of the first electrode layer 120. However, embodiments are not limited thereto. Preferably, the hole plugging process may be performed such that the upper surface of the insulating member 150 is positioned higher than the upper surface of the first metal layer 121 of the first electrode layer 120.

For example, the lower surface of the insulating member 150 may be formed to be positioned on the same plane as the lower surface of the third metal layer 131 of the second electrode layer 130. However, embodiments are not limited thereto. Preferably, the hole plugging process may be performed so that the lower surface of the insulating member 150 is positioned lower than the lower surface of the third metal layer 131 of the second electrode layer 130.

Figure 11:
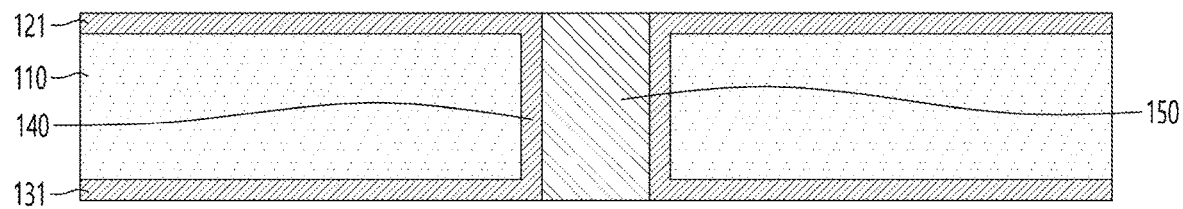

Next, referring to FIG. 11, the embodiment may proceed with a process of removing the first mask M1 and the second mask M2 when the forming process of the insulating member 150 is completed.

Figure 12:
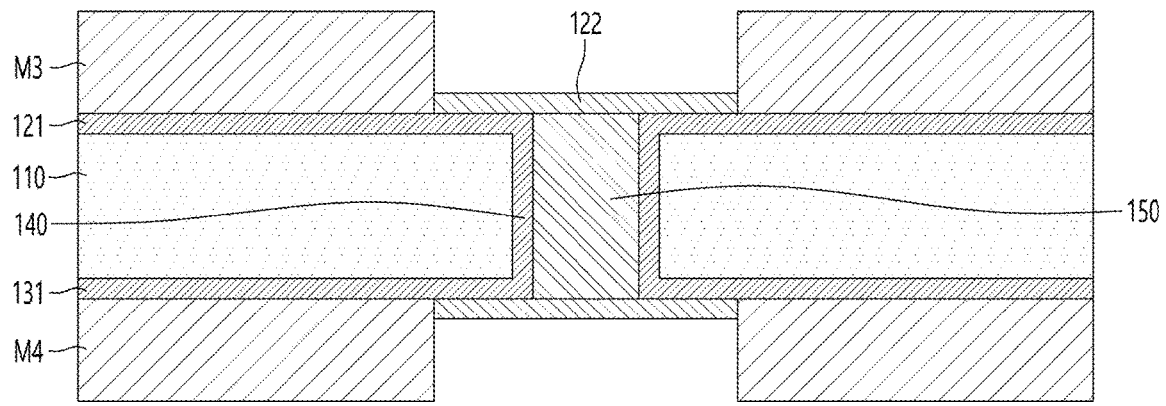

Next, referring to FIG. 12, the embodiment may proceed with a process of forming a third mask M3 on the upper surface of the first metal layer 121 of the first electrode layer 120. In this case, the third mask M3 may include an opening (not shown) vertically overlapping a region where the second metal layer 122 is to be disposed on the upper surface of the first metal layer 121 of the first electrode layer 120.

In addition, the embodiment may proceed with a process of forming a fourth mask M4 on the lower surface of the third metal layer 131 of the second electrode layer 130. In this case, the fourth mask M4 may include an opening (not shown) vertically overlapping a region where the fourth metal layer 132 is to be disposed among the lower surfaces of the third metal layer 131 of the second electrode layer 130.

Next, the embodiment may proceed with a process of forming a second metal layer 122 of the first electrode layer 120 filling the opening of the third mask M3 by performing electrolytic plating on the first metal layer 121 as a seed layer. In addition, the embodiment may proceed with a process of forming a fourth metal layer 132 of the second electrode layer 130 filling the opening of the fourth mask M4 by performing electroplating on the third metal layer 131 as a seed layer.

Figure 13:
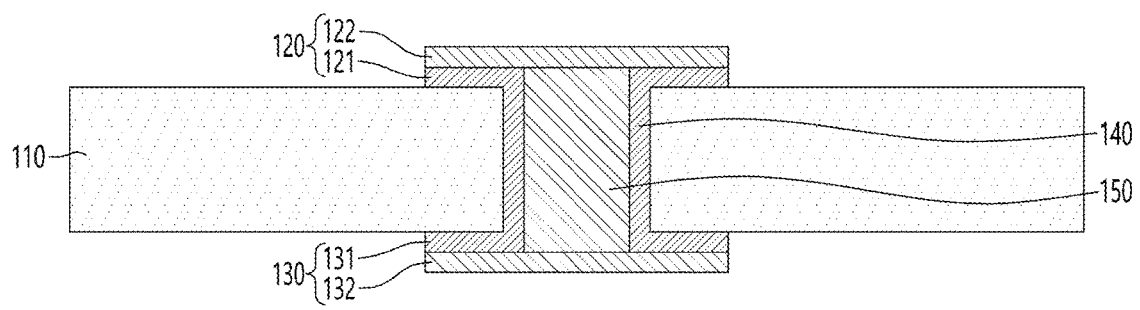
Figure 14:
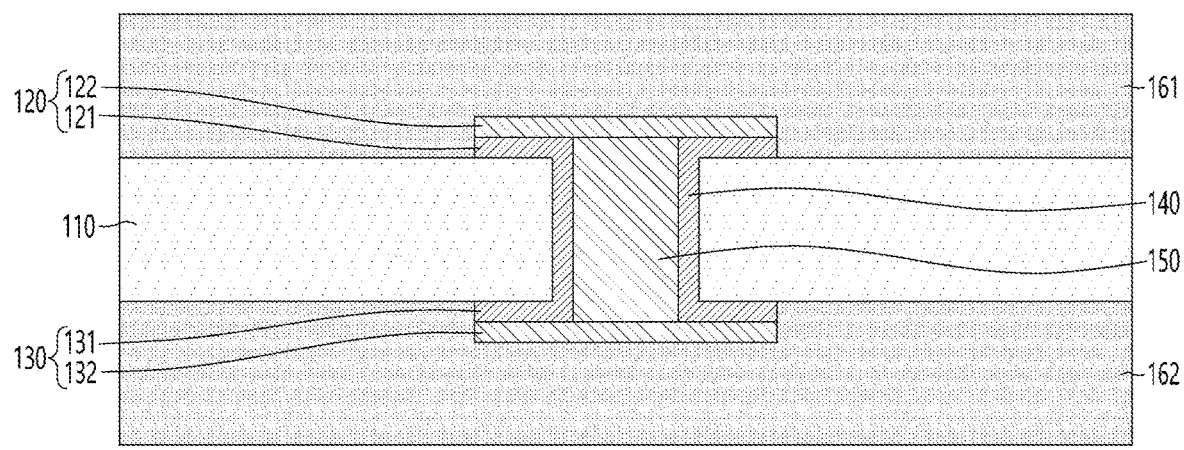

Next, referring to FIG. 13, the embodiment, the embodiment may proceed with a process of removing the third mask M3 and the fourth mask M4 when the second metal layer 122 of the first electrode layer 120 and the fourth metal layer 132 of the second electrode layer 130 are completely formed. In addition, the embodiment may proceed with a process of forming the first electrode layer 120 by removing a portion of the first metal layer 121 of the first electrode layer 120 that does not vertically overlap the second metal layer 122 by etching. In addition, the embodiment may proceed with a process of forming the second electrode layer 130 by removing a portion of the third metal layer 131 of the second electrode layer 130 that does not vertically overlap with the fourth metal layer 132 by etching, Next, referring to FIG. 14, the embodiment may proceed with a process of disposing a second insulating layer 161 on the upper surface of the first insulating layer 110 and a third insulating layer 162 on the lower surface of the first insulating layer 110. In this case, each of the second insulating layer 161 and the third insulating layer 162 may include an insulating material different from that of the first insulating layer 110. For example, the second insulating layer 161 and the third insulating layer 162 may include prepreg or ABF. In addition, the second insulating layer 161 and the third insulating layer 162 may have a thickness smaller than that of the first insulating layer 110.

Figure 15:
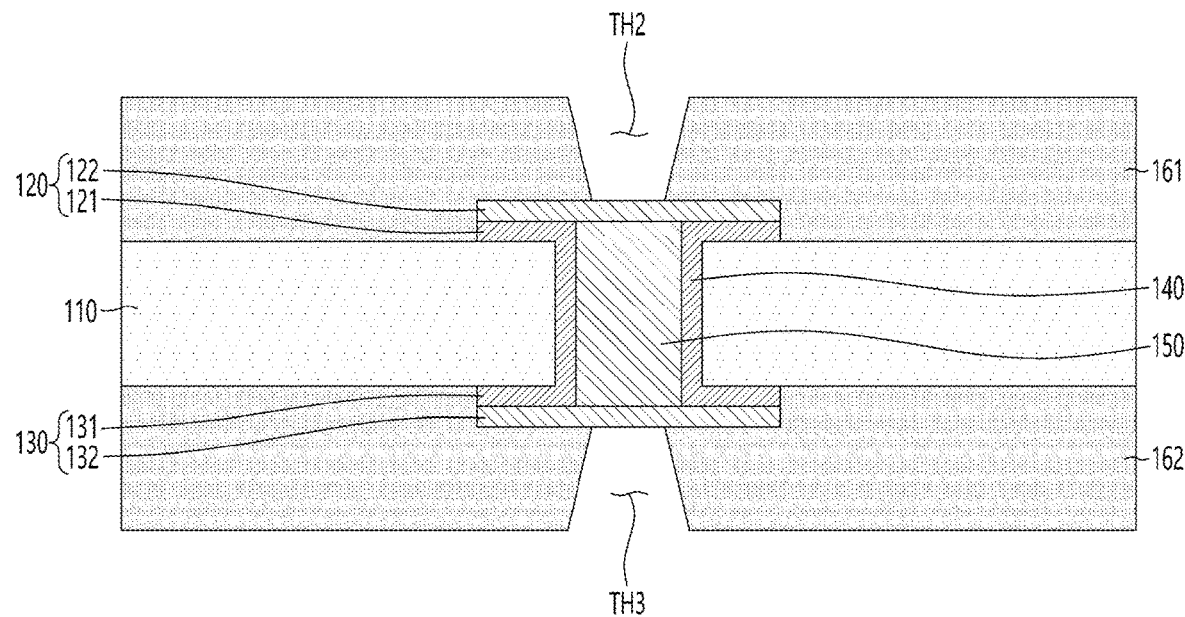

Next, referring to FIG. 15, the embodiment may proceed with a process of forming a second through hole TH2 in the second insulating layer 161. Preferably, the embodiment may proceed with a process of forming the second through hole TH2 in a region vertically overlaps the first through hole TH1 or a region vertically overlaps the first through electrode 140 and the insulating member 150.

In addition, the embodiment may proceed with a process of forming a third through hole TH3 in the third insulating layer 162. Preferably, the embodiment may proceed with a process of forming the third through hole TH3 in a region vertically overlapping the first through hole TH1 and the second through hole TH2.

In this case, the second through hole TH2 and the third through hole TH3 may have a shape different from that of the first through hole TH1.

Figure 16:
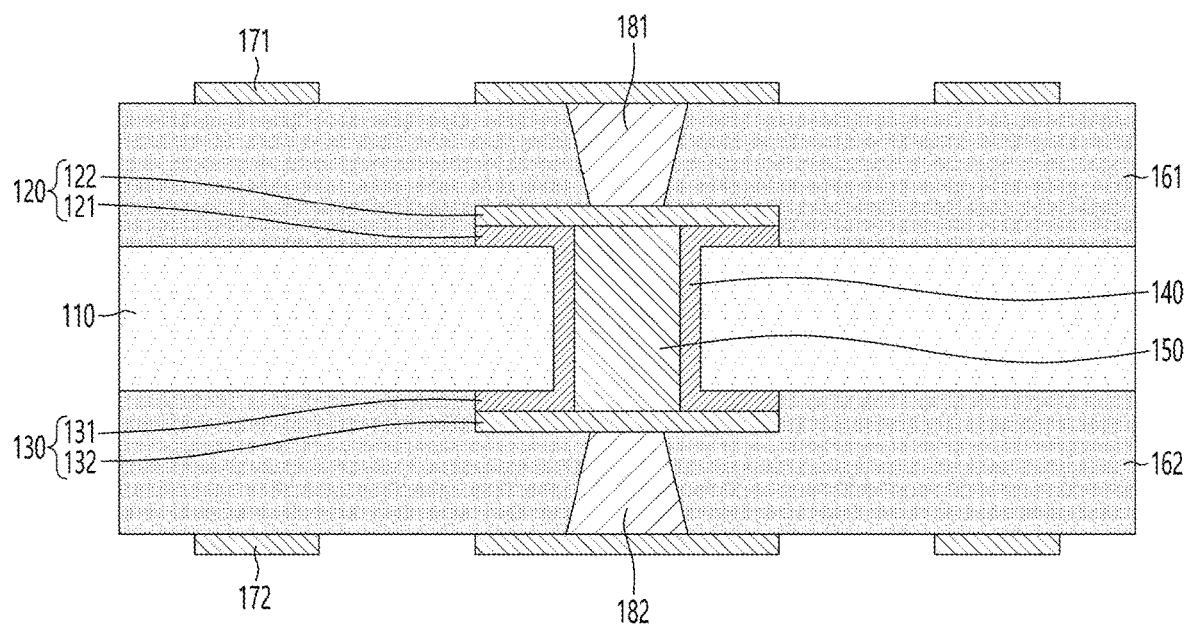

Next, referring to FIG. 16, the embodiment may proceed with a process of forming the second through electrode 181 in the second through hole TH2 of the second insulating layer 161 and a process of forming the third electrode layer 171 on the upper surface of the second insulating layer 161. In addition, the embodiment may proceed with a process of forming the third through electrode 182 in the third through hole TH3 of the third insulating layer 162 and a process of forming the fourth electrode layer 172 on the lower surface of the third insulating layer 162.

The circuit board of the embodiment includes a through electrode layer penetrating the first insulating layer and a first electrode layer disposed on the first insulating layer. In this case, the through-electrode layer includes a first through-electrode disposed on an inner wall of the first through-hole penetrating the first insulating layer and an insulating member. The first electrode layer includes a first region R1 that does not vertically overlap the insulating member and a second region R2 that vertically overlaps the insulating member. The first region R1 of the first electrode layer has a multilayer structure including a first metal layer and a second metal layer. The second region R2 of the first electrode layer may include only the second metal layer. For example, the number of metal layers in the first region R1 of the first electrode layer may be greater than the number of metal layers in the second region R2 of the first electrode layer.

Accordingly, the thickness of the first region R1 of the first electrode layer may be greater than that of the second region R2. Preferably, a thickness of the first electrode layer in a region vertically overlapping with the insulating member may be smaller than a thickness of the first electrode layer in a region not vertically overlapping with the insulating member. Accordingly, the embodiment may reduce the thickness of the first electrode layer in the second region R2 compared to the comparative example. Accordingly, according to the embodiment, the plating process time for forming the first electrode layer can be reduced, and furthermore, the plating process cost can be reduced.

As described above, the core layer of the circuit board is not composed of only the copper-clad laminate, but is composed of a combination of the copper-clad laminate and prepreg or ABF. Accordingly, the embodiment can reduce the thickness of the electrode layers disposed on the upper and lower surfaces of the core layer of the circuit board. In addition, the embodiment can reduce the line width and space of the electrode layers disposed on the upper and lower surfaces of the core layer of the circuit board. Accordingly, in the embodiment, it is possible to miniaturize the electrode layers disposed on the upper and lower surfaces of the core layer, and accordingly, the overall thickness of the circuit board can be reduced.

On the other hand, when the circuit board having the above-described characteristics of the invention is used in an IT device or home appliance such as a smart phone, a server computer, a TV, and the like, functions such as signal transmission or power supply can be stably performed. For example, when the circuit board having the features of the present invention performs a semiconductor package function, it can function to safely protect the semiconductor chip from external moisture or contaminants, or alternatively, it is possible to solve problems of leakage current, electrical short circuit between terminals, and electrical opening of terminals supplied to the semiconductor chip. In addition, when the function of signal transmission is in charge, it is possible to solve the noise problem. Through this, the circuit board having the above-described characteristics of the invention can maintain the stable function of the IT device or home appliance, so that the entire product and the circuit board to which the present invention is applied can achieve functional unity or technical interlocking with each other.

When the circuit board having the characteristics of the invention described above is used in a transport device such as a vehicle, it is possible to solve the problem of distortion of a signal transmitted to the transport device, or alternatively, the safety of the transport device can be further improved by safely protecting the semiconductor chip that controls the transport device from the outside and solving the problem of leakage current or electrical short between terminals or the electrical opening of the terminal supplied to the semiconductor chip. Accordingly, the transportation device and the circuit board to which the present invention is applied can achieve functional integrity or technical interlocking with each other. Furthermore, when the circuit board having the above-described characteristics of the invention is used in a transportation device such as a vehicle, it is possible to transmit a high-current signal required by the vehicle at a high speed, thereby improving the safety of the transportation device. Furthermore, the circuit board and the semiconductor package including the same can be operated normally even in an unexpected situation occurring in various driving environments of the transportation device, thereby safely protecting the driver.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

In the above, the embodiment has been mainly described, but this is only an example and does not limit the embodiment, and those of ordinary skill in the art to which the embodiment pertains will appreciate that various modifications and applications not illustrated above are possible without departing from the essential characteristics of the present embodiment. For example, each component specifically shown in the embodiment can be implemented by modification. And the differences related to these modifications and applications should be interpreted as being included in the scope of the embodiments set forth in the appended claims.

What is claimed is:

1. A circuit board comprising:
   a first insulating layer including a through hole;
   an insulating member disposed in the through hole of the first insulating layer;
   a first through electrode disposed in the through hole of the first insulating layer and surrounding at least a part of the insulating member;
   a first electrode layer disposed on the insulating member and the first through electrode;
   a second insulating layer disposed on the first electrode layer; and
   a second through electrode passing through the second insulating layer,
   wherein the second through electrode overlaps the first electrode layer and the insulating member in a vertical direction,
   wherein the first electrode layer includes a first region overlapping the first insulating layer in the vertical direction, and a second region overlapping the insulating member in the vertical direction, and
   wherein a thickness of the first region of the first electrode layer is different from a thickness of the second region of the first electrode layer.

2. The circuit board of claim 1, further comprising:
   a second electrode layer disposed under the insulating member and the first through electrode;
   a third insulating layer under disposed under the second electrode layer; and a third through electrode passing through the third insulating layer, and wherein the third through electrode overlaps the first electrode layer, the second electrode layer, the second through electrode and the insulating member in the vertical direction.

3. The circuit board of claim 2, wherein the second electrode layer includes a fourth region overlapping the first insulating layer in the vertical direction, and a fifth region overlapping the insulating member in the vertical direction, and wherein a thickness of the fourth region of the second electrode layer is different from a thickness of the fifth region of the second electrode layer.

4. The circuit board of claim 1, wherein the thickness of the first region of the first electrode layer is greater than the thickness of the second region of the first electrode layer.

5. The circuit board of claim 1, wherein the first electrode layer further includes a third region provided between the first region and the second region and overlapping the first through electrode in the vertical direction, and wherein a thickness of the third region of the first electrode layer is greater than the thickness of the second region.

6. The circuit board of claim 1, wherein an upper surface of the insulating member is positioned higher than an upper surface of the first insulating layer.

7. The circuit board of claim 1, wherein the first electrode layer includes:

a first metal layer disposed on an upper surface of the first insulating layer; and a second metal layer disposed on the first metal layer and the first through electrode.

8. The circuit board of claim 7, wherein a thickness of the first region of the second metal layer of the first electrode layer is different from a thickness of the second region of the second metal layer of the first electrode layer, and wherein a lower surface of the second metal layer includes a concave portion concave toward the insulating member.

9. The circuit board of claim 1, wherein the first insulating layer includes a copper clad laminate (CCL).

10. The circuit board of claim 9, wherein the first insulating layer has a thickness ranging from 80 μm to 150 μm.

11. The circuit board of claim 3, wherein the thickness of the fourth region of the second electrode layer is greater than the thickness of the fifth region of the second electrode layer.

12. The circuit board of claim 3, wherein the second insulating layer or the third insulating layer includes any one of prepreg and ABF (Ajinomoto Build-up Film).

13. The circuit board of claim 3, wherein the first insulating layer, the second insulating layer and the third insulating layer are core layers of the circuit board.

14. The circuit board of claim 13, wherein the first through electrode, the first electrode layer, the second through electrode, the second electrode layer, and the third through electrode are a core through electrode passing through an upper surface and a lower surface of the core layers.

15. The circuit board of claim 13, wherein the second through electrode is not disposed in a region of the second insulating layer that does not vertically overlap the first through electrode.

16. The circuit board of claim 5, wherein an inclination of a side surface of the second through electrode is perpendicular to an upper surface or a lower surface of the first insulating layer.

17. The circuit board of claim 9, wherein a shape of the first through electrode is different from a shape of the second through electrode.

* * * * *